(12) United States Patent
Izumi et al.

(10) Patent No.: US 11,355,593 B2
(45) Date of Patent: Jun. 7, 2022

(54) SEMICONDUCTOR DEVICE

(71) Applicant: TOYODA GOSEI CO., LTD., Kiyosu (JP)

(72) Inventors: Takatomi Izumi, Kiyosu (JP); Junya Nishii, Kiyosu (JP); Yuhei Ikemoto, Kiyosu (JP)

(73) Assignee: TOYODA GOSEI CO., LTD., Kiyosu (JP)

( * ) Notice: Subject to any disclaimer, the term of this patent is extended or adjusted under 35 U.S.C. 154(b) by 29 days.

(21) Appl. No.: 16/135,482

(22) Filed: Sep. 19, 2018

(65) Prior Publication Data

US 2019/0103464 A1 Apr. 4, 2019

(30) Foreign Application Priority Data

Sep. 29, 2017 (JP) .............................. JP2017-189645

(51) Int. Cl.
| | |
|---|---|
| *H01L 29/20* | (2006.01) |
| *H01L 21/28* | (2006.01) |
| *H01L 21/02* | (2006.01) |
| *H01L 29/417* | (2006.01) |
| *H01L 29/49* | (2006.01) |
| *H01L 29/423* | (2006.01) |
| *H01L 29/78* | (2006.01) |
| *H01L 29/51* | (2006.01) |
| *H01L 21/3205* | (2006.01) |

(52) U.S. Cl.
CPC .... *H01L 29/2003* (2013.01); *H01L 21/02241* (2013.01); *H01L 21/28264* (2013.01); *H01L 21/3205* (2013.01); *H01L 29/41725* (2013.01); *H01L 29/4236* (2013.01); *H01L 29/4966* (2013.01); *H01L 29/518* (2013.01); *H01L 29/78* (2013.01); *H01L 29/7813* (2013.01); *H01L 29/51* (2013.01)

(58) Field of Classification Search
CPC .................................................. H01L 29/2003
See application file for complete search history.

(56) References Cited

U.S. PATENT DOCUMENTS

| | | | | |
|---|---|---|---|---|
| 9,048,304 | B2* | 6/2015 | Fujimoto | H01L 29/2003 |
| 10,032,673 | B1* | 7/2018 | Chen | H01L 21/823462 |
| 2015/0069405 | A1* | 3/2015 | Yoshioka | H01L 29/2003 |
| | | | | 257/76 |
| 2017/0108545 | A1* | 4/2017 | Sometani | H01L 29/2003 |
| 2018/0019322 | A1* | 1/2018 | Takashima | H01L 29/4236 |
| 2018/0122642 | A1* | 5/2018 | Raisanen | H01L 21/28088 |

FOREIGN PATENT DOCUMENTS

| | | |
|---|---|---|
| JP | 2010-267936 A | 11/2010 |
| JP | 2012-104735 A | 5/2012 |

* cited by examiner

*Primary Examiner* — Trang Q Tran
(74) *Attorney, Agent, or Firm* — McGinn IP Law Group, PLLC

(57) ABSTRACT

A semiconductor device comprises: a nitride semiconductor layer; an oxide insulating film formed to contact the nitride semiconductor layer; and a gate electrode formed to contact the oxide insulating film and made of metal nitride in a crystal orientation including at least one of the (200) orientation and the (220) orientation.

20 Claims, 15 Drawing Sheets

SEMICONDUCTOR DEVICE

CROSS-REFERENCE TO RELATED APPLICATIONS

The present application claims priority from Japanese patent application 2017-189645 filed on Sep. 29, 2017, the entirety of the content of which is hereby incorporated by reference into this application.

BACKGROUND

Field

The present invention relates to a semiconductor device.

Related Art

Some semiconductor devices include a nitride semiconductor layer. In such a semiconductor device, nitrogen may escape from the nitride semiconductor layer during process of manufacturing the semiconductor device. For example, escape of nitrogen may occur if a surface of the nitride semiconductor layer is etched by dry etching using plasma or if an oxide film is formed as an insulating film on the surface of the nitride semiconductor layer.

In a nitride semiconductor device described in JP 5822024, an insulating film made of silicon nitride is formed to contact a nitride semiconductor layer, thereby compensating for escape of nitrogen from the nitride semiconductor layer. However, depositing the insulating film of silicon nitride by atomic layer deposition process widely used for insulating film deposition causes technical difficulties such as failing to deposit a high-quality insulating film and extended time for film deposition. To solve such problems, a technique has been desired capable of compensating for escape of nitrogen from the nitride semiconductor layer without using an insulating film made of silicon nitride.

SUMMARY

The present invention has been made to solve at least some of the foregoing problems and is feasible in the following aspects.

According to one aspect of the present invention, a semiconductor device is provided. The semiconductor device comprises: a nitride semiconductor layer; an oxide insulating film formed to contact the nitride semiconductor layer; and a gate electrode formed to contact the oxide insulating film and made of metal nitride in a crystal orientation including at least one of the (200) orientation and the (220) orientation.

DETAILED DESCRIPTION

A. First Embodiment

Figure 1:
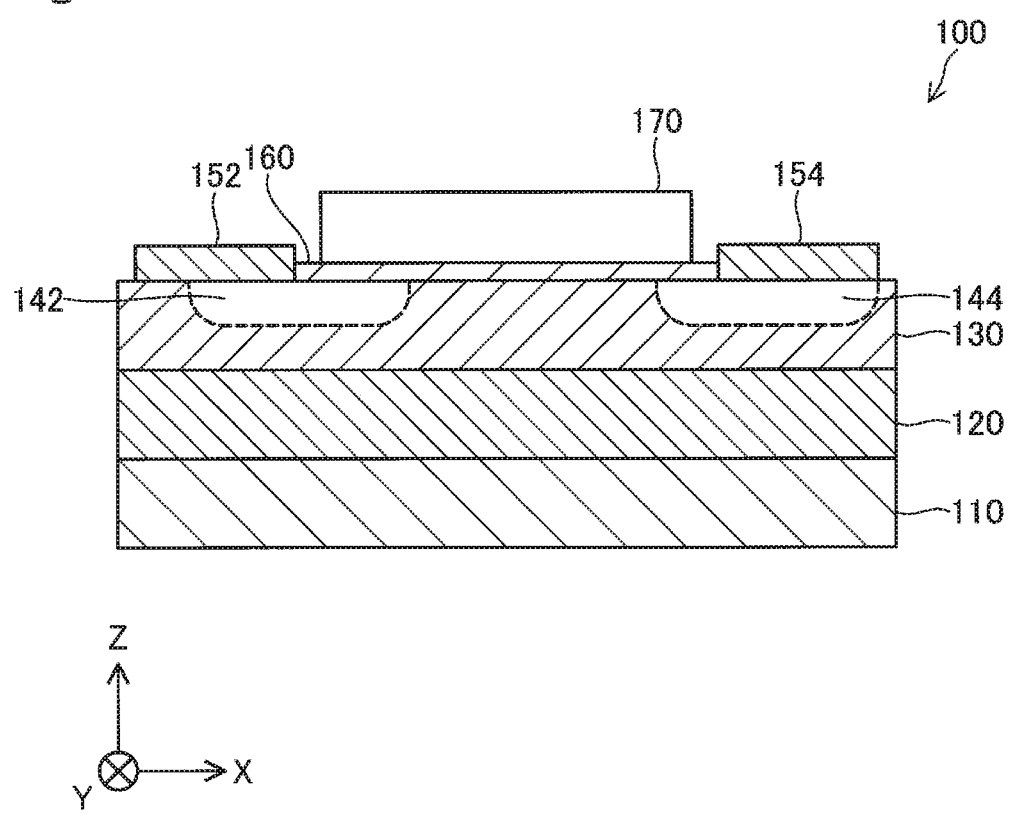
FIG. 1 is a sectional view schematically showing the configuration of a semiconductor device.

FIG. 1 is a sectional view schematically showing the configuration of a semiconductor device 100. An X axis, a Y axis, and a Z axis orthogonal to each other are illustrated in FIG. 1. The X axis extends from left to right of FIG. 1. The Y axis extends from front to back of the plane of FIG. 1. The Z axis extends from bottom to top of FIG. 1. In this specification, a direction toward the +Z axis may be called "being on" for the sake of convenience. This phrase "being on" is not intended to limit the arrangement (orientation) of the semiconductor device 100. Specifically, the orientation of the semiconductor device 100 may be determined freely.

The semiconductor device 100 is a semiconductor device based on a group-III nitride formed using a group-III nitride semiconductor. In this embodiment, the semiconductor device 100 is a GaN-based semiconductor device formed using gallium nitride (GaN) and is what is called a lateral metal-oxide-semiconductor field-effect transistor (MOSFET). In this embodiment, the semiconductor device 100 is used for power control and is also called a power device.

The semiconductor device 100 includes a substrate 110, an i-type semiconductor layer 120, a p-type semiconductor layer 130, an n-type semiconductor region 142, an n-type semiconductor region 144, a source electrode 152, a drain electrode 154, a gate insulating film 160, and a gate electrode 170.

The substrate 110, the i-type semiconductor layer 120, and the p-type semiconductor layer 130 are plate-like semiconductors extending along the X axis and the Y axis. In this embodiment, the substrate 110, the i-type semiconductor layer 120, and the p-type semiconductor layer 130 are made of gallium nitride (GaN) as a group-III nitride semiconductor. Examples of the group-III nitride semiconductor include aluminum nitride (AlN), aluminum gallium nitride (AlGaN), indium gallium nitride (InGaN), and indium aluminum gallium nitride (InAlGaN), in addition to gallium nitride (GaN). In terms of being used in a semiconductor device for power control, the group-III nitride semiconductor is preferably gallium nitride (GaN) or aluminum gallium nitride (AlGaN). Gallium nitride (GaN) may partially be replaced by a different group-III element such as aluminum (Al) or indium (In) or gallium nitride may contain impurity of a different element within a range in which the effect of this embodiment is achieved.

The substrate 110 is a semiconductor having n-type properties. In this embodiment, the substrate 110 contains silicon (Si) as a donor element.

The i-type semiconductor layer 120 is a semiconductor having i-type properties. A semiconductor having i-type properties is an undoped semiconductor in which impurity is not developed intentionally. The i-type semiconductor layer 120 is arranged on the substrate 110.

The p-type semiconductor layer 130 is a semiconductor having p-type properties. The p-type semiconductor layer 130 is arranged on the i-type semiconductor layer 120. In this embodiment, the p-type semiconductor layer 130 contains magnesium (Mg) as an acceptor element.

The n-type semiconductor region 142 and the n-type semiconductor region 144 are semiconductors having n-type properties. The n-type semiconductor region 144 is formed on a part of the p-type semiconductor layer 130 closer to the direction of the +X axis. The n-type semiconductor region 142 is formed on a part of the p-type semiconductor layer 130 closer to the direction of the −X axis. The n-type semiconductor region 142 and the n-type semiconductor region 144 are formed by implanting ions of silicon (Si) as impurity into the p-type semiconductor layer 130 and by performing activation process (annealing) with heat.

The source electrode 152 is arranged so as to extend across the n-type semiconductor region 142 and the p-type semiconductor layer 130 from above. The drain electrode 154 is arranged on the n-type semiconductor layer 144 but does not contact the p-type semiconductor layer 130.

The gate insulating film 160 has electrical insulating properties. The gate insulating film 160 is formed between the source electrode 152 and the drain electrode 154 so as to contact all the p-type semiconductor layer 130, the n-type semiconductor region 142, and the n-type semiconductor region 144. In this embodiment, the gate insulating film 160 is made of silicon oxide ($SiO_2$). The gate insulating film 160 of a different embodiment may be made of aluminum oxide ($Al_2O_3$). In this embodiment, the gate insulating film 160 is formed by atomic layer deposition process.

The gate electrode 170 is formed to contact the gate insulating film 160 from above. In this embodiment, the gate electrode 170 is made of titanium nitride (TiN). If a voltage is applied to the gate electrode 170, an inversion layer is formed in the p-type semiconductor layer 130. This inversion layer functions as a channel to form a conducting path between the source electrode 152 and the drain electrode 154.

In this embodiment, the gate electrode 170 is made of titanium nitride in a crystal orientation including the (200) orientation. The crystal orientation of titanium nitride mainly exhibits the (111) orientation, the (200) orientation, and the (220) orientation. Crystal of titanium nitride forming the gate electrode 170 and including the (111) orientation has grown diagonally to the plane of the gate insulating film 160. Crystal of titanium nitride forming the gate electrode 170 and including the (200) orientation has grown vertically to the plane of the gate insulating film 160.

Figure 2:
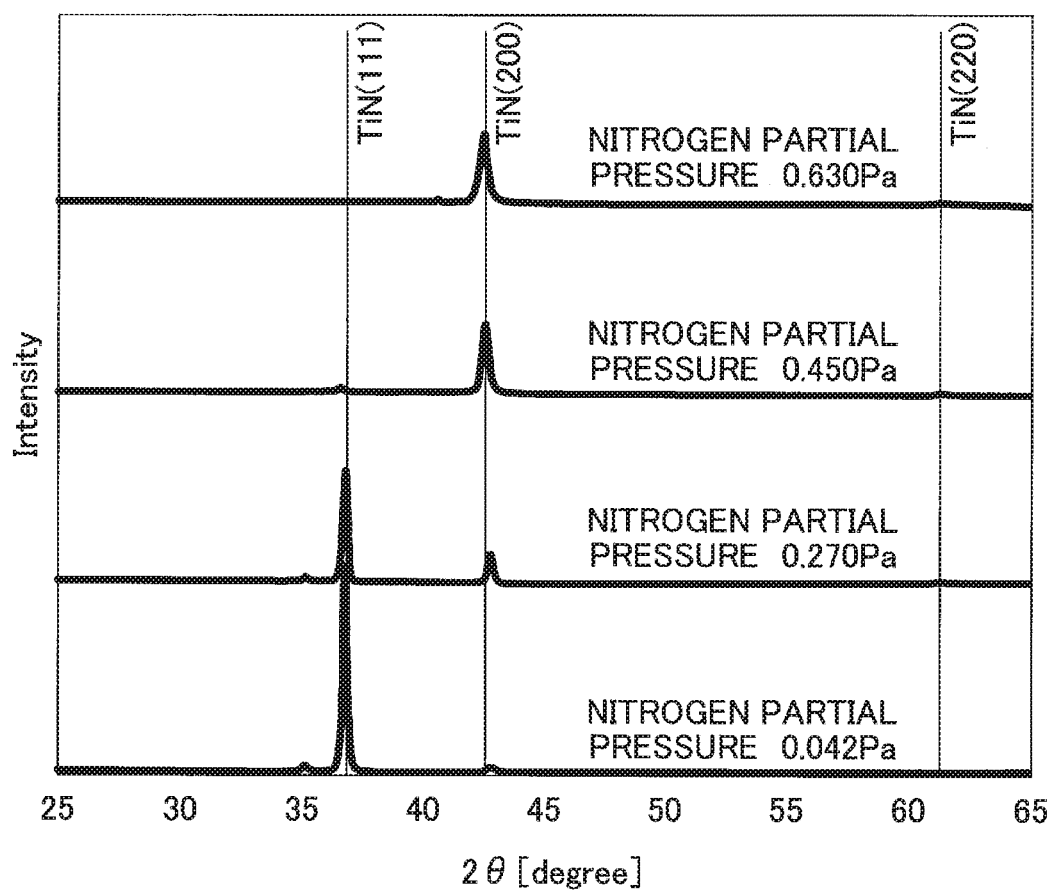
FIG. 2 is an explanatory view showing a result of measurement conducted by X-ray diffraction process.

In this embodiment, the gate electrode 170 is formed by reactive sputtering process. FIG. 2 is an explanatory view showing a result of measurement conducted by X-ray diffraction process on gate electrodes formed by reactive sputtering process in a processing chamber under various conditions of nitrogen partial pressure. The horizontal axis of FIG. 2 shows a diffraction angle. The vertical axis of FIG. 2 shows a diffraction intensity. Waveforms in FIG. 2 each show the state of the crystal orientation of titanium nitride as a gate electrode formed to contact the gate insulating film 160 under a corresponding condition of nitrogen partial pressure. The result of FIG. 2 shows that the (111) orientation is dominant in the crystal orientation of titanium nitride forming a gate electrode under a condition that nitrogen partial pressure in the processing chamber is 0.042 Pa, whereas the ratio of the (111) orientation is reduced and the ratio of the (200) orientation is increased in the crystal orientation of titanium nitride forming the gate electrode at higher nitrogen partial pressure. In this embodiment, the gate electrode 170 is formed by reactive sputtering process under a condition that nitrogen partial pressure in the processing chamber is 0.270 Pa. The gate electrode 170 of a different embodiment may be formed by reactive sputtering process under a condition that nitrogen partial pressure in the processing chamber is higher than 0.270 Pa.

If the gate electrode 170 is formed by reactive sputtering process, a plane where crystal grows at high speed has an advantage in determining crystal orientation. If nitrogen partial pressure in the processing chamber is low, the (111) orientation becomes a dominant orientation. Meanwhile, if nitrogen partial pressure in the processing chamber is 0.270 Pa or more, the (200) orientation begins to appear. Regarding titanium nitride, the (200) orientation causes nitrogen to be diffused more easily along a crystal grain boundary than the (111) orientation, as will be described later.

In this embodiment, the gate electrode 170 is formed by reactive sputtering process and then subjected to heating process. The effect of heating process will be described by referring to FIGS. 3 to 6. FIGS. 3 to 6 are explanatory views showing results of measurement conducted by backside SIMS on samples including gate electrodes formed under respective conditions. The measured sample shown in each of FIGS. 3 to 6 includes an Si substrate, and a gate insulating film made of silicon oxide and a gate electrode made of titanium nitride stacked sequentially over the Si substrate. The measured samples shown in FIGS. 3 to 6 differ in terms of the state of the crystal orientation of the gate electrode or the presence or absence of heating process to be performed after reactive sputtering process. The horizontal axis of each of FIGS. 3 to 6 shows a depth from a surface of the Si substrate. The vertical axis of each of FIGS. 3 to 6 shows a nitrogen concentration.

Figure 3:
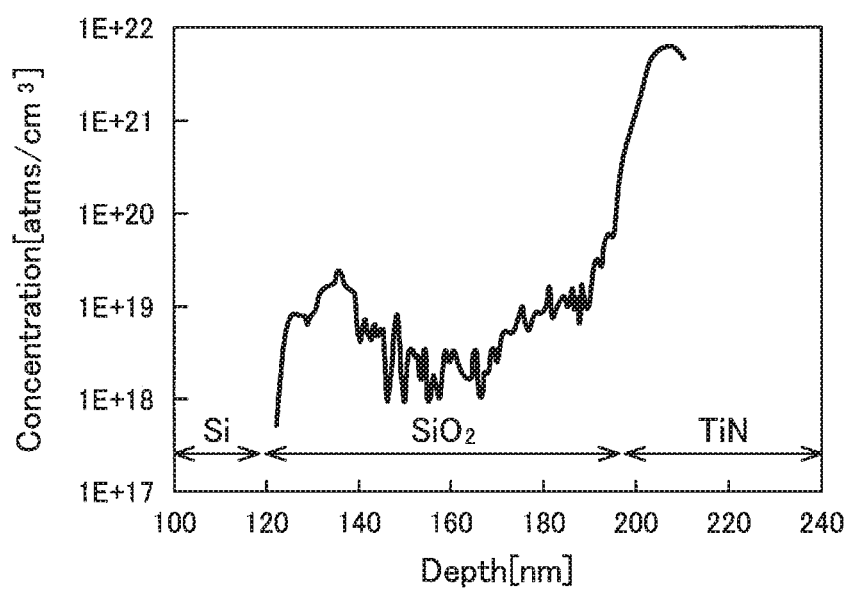
FIGS. 3 to 6 are explanatory views each showing a result of measurement conducted by backside SIMS.
Figure 4:
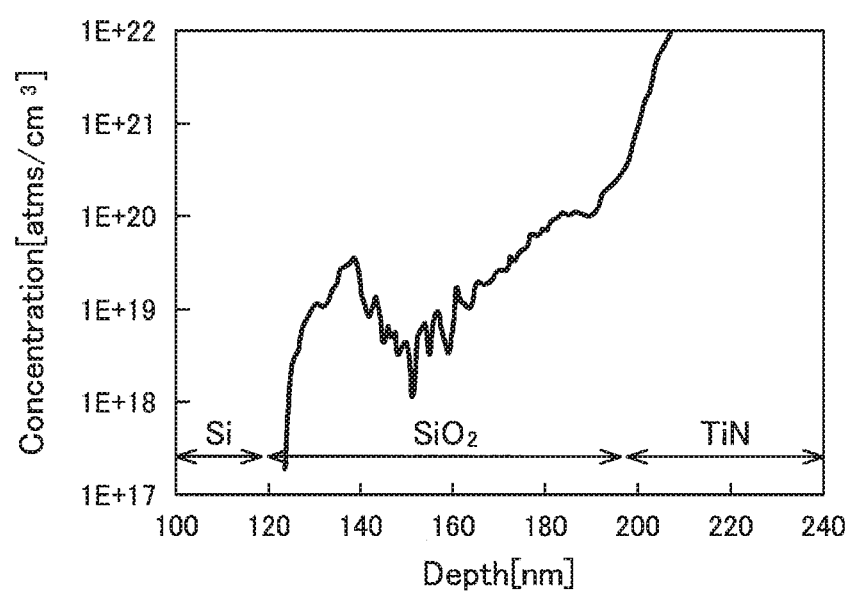
Figure 5:
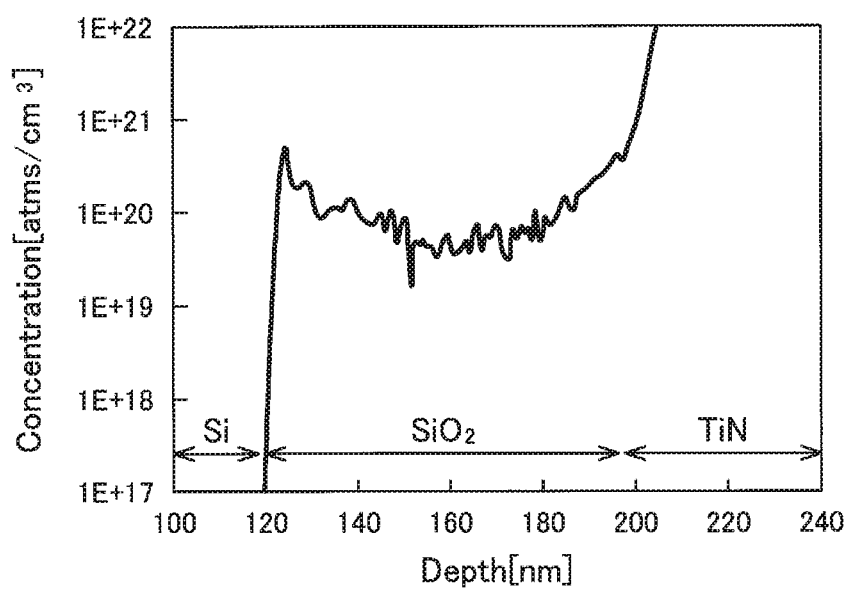
Figure 6:
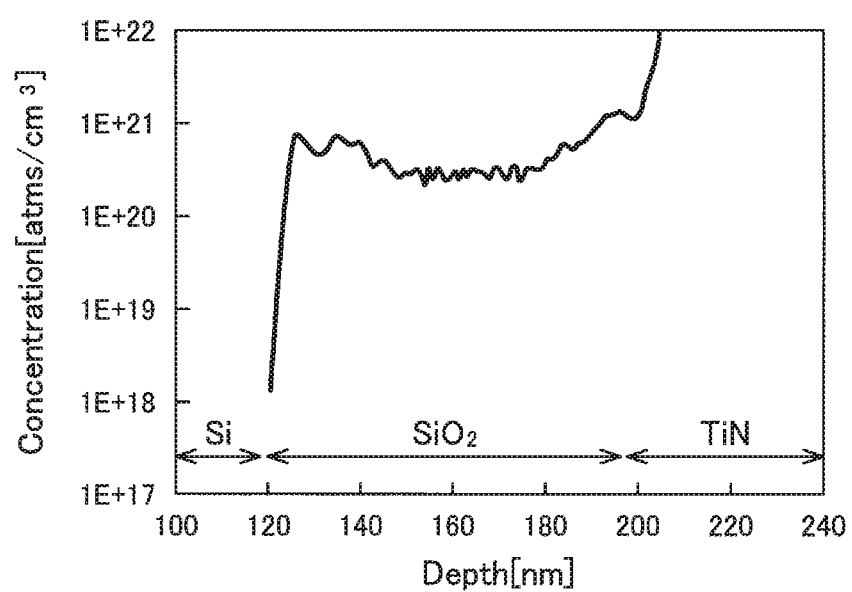

FIG. 3 shows a measurement result about a sample including a gate electrode made of titanium nitride in which the (111) orientation is dominant formed under the condition shown in FIG. 2 that nitrogen partial pressure in the processing chamber is 0.042 Pa and without being subjected to heating process. FIG. 4 shows a measurement result about a sample including a gate electrode made of titanium nitride including the (200) orientation formed under the condition shown in FIG. 2 that nitrogen partial pressure in the processing chamber is 0.270 Pa and without being subjected to heating process. FIG. 5 shows a measurement result about a sample prepared by performing heating process on the sample of FIG. 3. FIG. 6 shows a measurement result about a sample prepared by performing heating process on the sample of FIG. 4. A combination of a gate insulating film and a gate electrode in the measured sample shown in FIG. 6 corresponds to a combination of the gate insulating film 160 and the gate electrode 170 in the semiconductor device 100 of this embodiment.

Comparison between FIGS. 3 and 4 shows that, in terms of the amount of diffused nitrogen in the gate insulating film within a range indicated as $SiO_2$ in the horizontal axis of each of FIGS. 3 and 4, a nitrogen concentration is higher in the case of FIG. 4. Thus, the presence of the (200) orientation in titanium nitride forming the gate electrode was confirmed to be capable of causing more nitrogen to be diffused from the gate electrode toward the gate insulating film. Thus, regarding titanium nitride, supposition was made based on the results of FIGS. 3 and 4 that the (200) orientation causes diffusion of nitrogen along a crystal grain boundary more easily than the (111) orientation.

Comparison between FIGS. 3 and 5 and comparison between FIGS. 4 and 6 show that, in terms of the amount of diffused nitrogen in the gate insulating film, a nitrogen concentration is higher in the cases of FIGS. 5 and 6. Thus, the gate electrode formed by reactive sputtering process and subjected to subsequent heating process was confirmed to be capable of causing more nitrogen to be diffused. This result is considered to be achieved for a reason that nitrogen existing at a crystal grain boundary of titanium nitride forming the gate electrode is allowed to come off the crystal grain boundary easily by heating process.

Like the comparison between FIGS. 3 and 4, comparison between FIGS. 5 and 6 shows that, in terms of the amount of diffused nitrogen in the gate insulating film, a nitrogen concentration is higher in the case of FIG. 6. Thus, regarding the gate electrodes subjected to heating process, the presence of the (200) orientation in titanium nitride forming the gate electrode was also confirmed to be capable of causing more nitrogen to be diffused from the gate electrode toward the gate insulating film.

Figure 7:
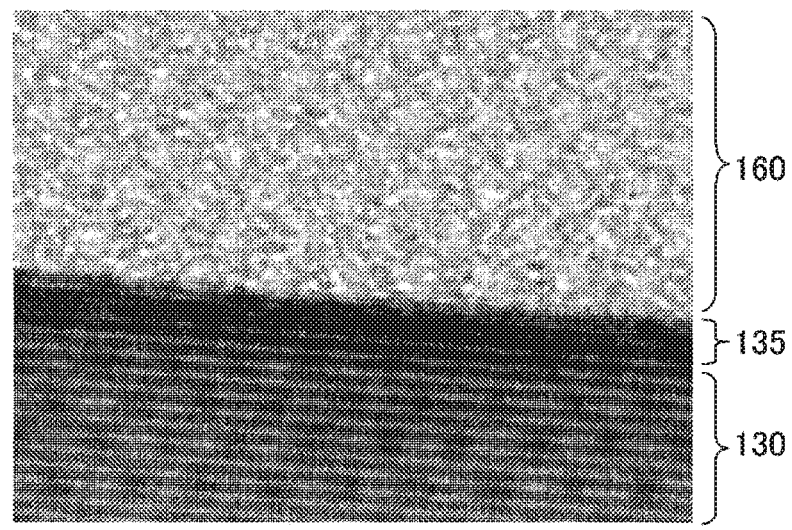
FIGS. 7 to 10 are explanatory views each showing an image observed using a TEM.
Figure 8:
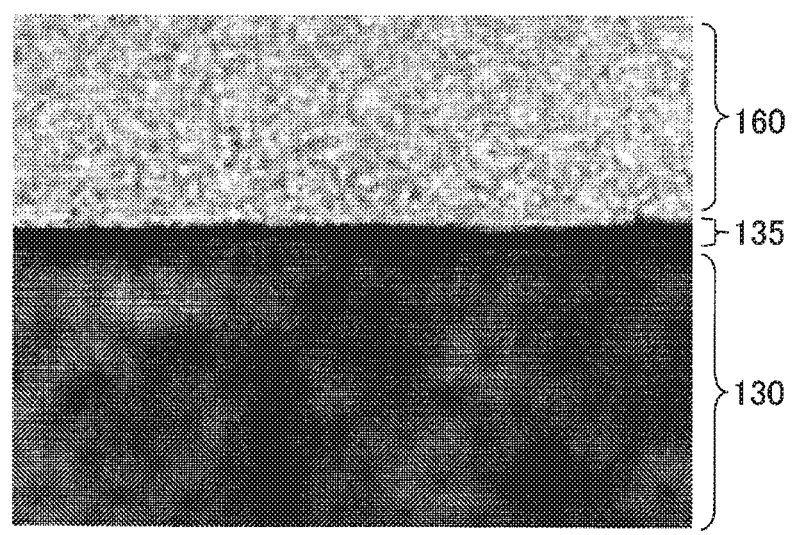

FIGS. 7, 8, 9, and 10 are explanatory views each showing an image of an interface between a p-type semiconductor layer and a gate insulating film forming a semiconductor device observed using a transmission electron microscope (TEM). FIGS. 7 and 8 each show an image of a semiconductor device 100a different from the semiconductor device 100 of this embodiment observed using the TEM. The semiconductor device 100a is similar to the semiconductor device 100 of this embodiment, except that a gate electrode in the semiconductor device 100a is formed using titanium nitride in which the (111) orientation is dominant under the condition shown in FIG. 2 that nitrogen partial pressure in the processing chamber is 0.042 Pa. The gate electrode in the semiconductor device 100a is subjected to heating process.

FIG. 7 shows an image of an interface between the p-type semiconductor layer 130 and the gate insulating film 160 observed from the direction of the a-plane of the p-type semiconductor layer 130 forming the semiconductor device 100a. FIG. 8 shows an image of an interface between the p-type semiconductor layer 130 and the gate insulating film 160 observed from the direction of the m-plane of the p-type semiconductor layer 130 forming the semiconductor device 100a.

Figure 9:
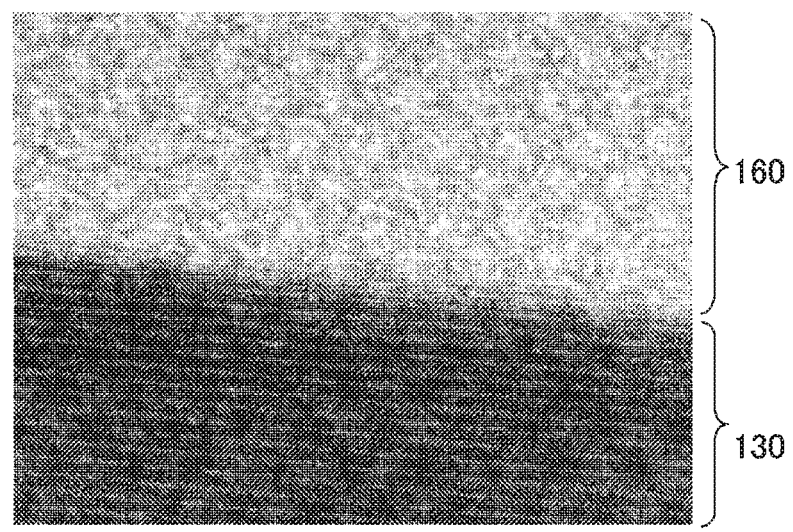
Figure 10:

FIGS. 9 and 10 each show an image of the semiconductor device 100 of this embodiment observed using the TEM. FIG. 9 shows an image of an interface between the p-type semiconductor layer 130 and the gate insulating film 160 observed from the direction of the a-plane of the p-type semiconductor layer 130 forming the semiconductor device 100. FIG. 10 shows an image of an interface between the p-type semiconductor layer 130 and the gate insulating film 160 observed from the direction of the m-plane of the p-type semiconductor layer 130 forming the semiconductor device 100.

In each of FIGS. 7 and 8, a modified layer 135 was observed at the interface between the p-type semiconductor layer 130 and the gate insulating film 160. The modified layer 135 is supposed to be a gallium oxide film resulting from oxidation of a surface of the p-type semiconductor layer 130 during formation of the gate insulating film 160 on the p-type semiconductor layer 130. During generation of the modified layer 135, the surface of the p-type semiconductor layer 130 is supposed to be in a state where gallium in gallium nitride (GaN) forming the p-type semiconductor layer 130 is bonded to oxygen to make nitrogen having been bonded to the gallium escape from the p-type semiconductor layer 130. By contrast, in each of FIGS. 9 and 10, the modified layer 135 was not observed at the interface between the p-type semiconductor layer 130 and the gate insulating film 160.

Figure 11:
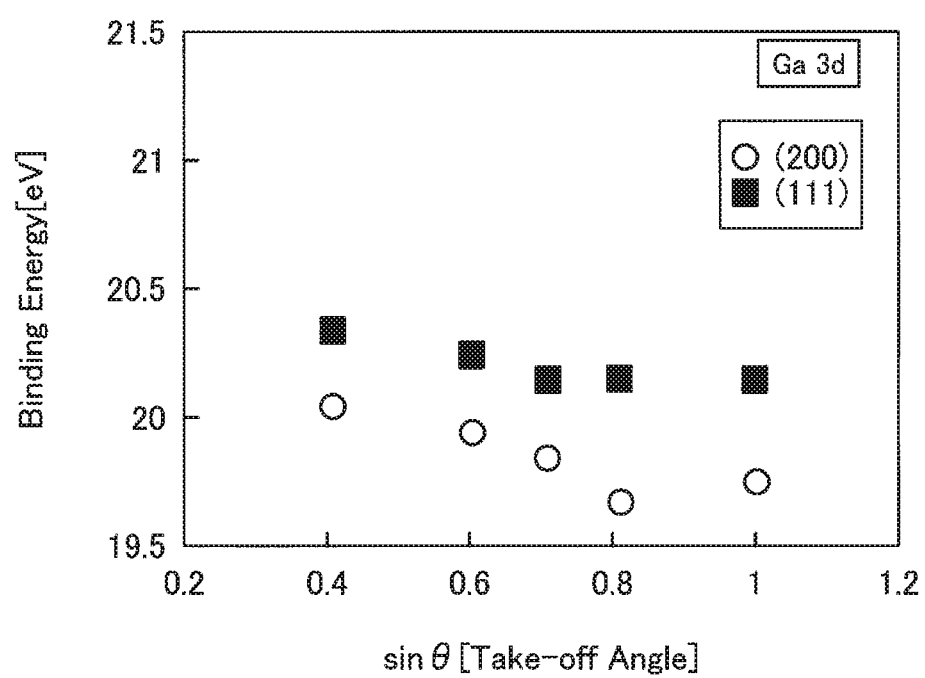
FIG. 11 is an explanatory view showing a result of measurement conducted by X-ray photoelectron spectroscopy.

FIG. 11 is an explanatory view showing a measurement result about the binding energy of gallium atoms on the 3d orbital at the interface between the p-type semiconductor layer 130 and the gate insulating film 160 observed by X-ray photoelectron spectroscopy (XPS). In FIG. 11, solid rectangles show a measurement result about the interface between the p-type semiconductor layer 130 and the gate insulating film 160 in the semiconductor device 100a in which the (111) orientation is dominant in the crystal orientation of titanium nitride forming a gate electrode. In FIG. 11, white circles show a measurement result about the interface between the p-type semiconductor layer 130 and the gate insulating film 160 in the semiconductor device 100 in which the crystal orientation of titanium nitride forming the gate electrode 170 includes the (200) orientation. The horizontal axis of FIG. 11 shows the take-off angle of a photoelectron. The vertical axis of FIG. 11 shows binding energy. The result of FIG. 11 shows that the binding energy of gallium atoms on the 3d orbital at the interface is lower in the semiconductor device 100 of this embodiment than in the semiconductor device 100a.

Energy of binding between nitrogen and gallium is lower than energy of binding between oxygen and gallium. For this reason, the result of FIG. 11 shows that the concentration of nitrogen at the interface between the p-type semiconductor layer 130 and the gate insulating film 160 is higher in the semiconductor device 100 of this embodiment than in the semiconductor device 100a. Thus, in the semiconductor device 100, even if the modified layer 135 is generated to make nitrogen escape from the p-type semiconductor layer 130 during formation of the gate insulating film 160 on the p-type semiconductor layer 130, nitrogen in the p-type semiconductor layer 130 is to be compensated for from the gate electrode 170 through the gate insulating film 160 at a subsequent stage. In this way, the state of the interface between the p-type semiconductor layer 130 and the gate insulating film 160 was supposed to be recovered to a state without the modified layer 135.

Figure 12:
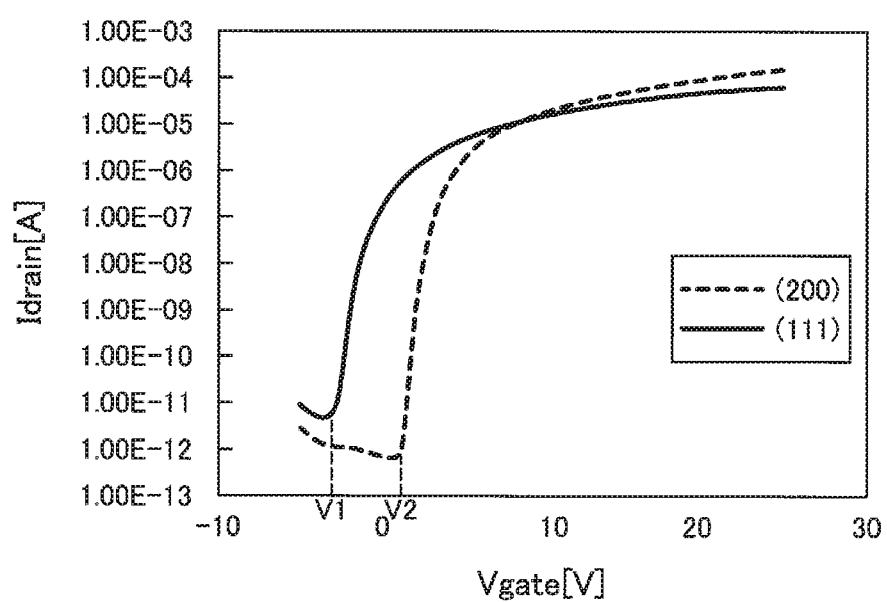
FIG. 12 is an explanatory view showing a measurement result about a gate voltage.

FIG. 12 is an explanatory view showing a measurement result about a threshold voltage to be applied to the gate electrode 170 for forming a conducting path between the source electrode 152 and the drain electrode 154. A solid line of FIG. 12 shows a measurement result about a threshold voltage in the semiconductor device 100a. A dashed line of FIG. 12 shows a measurement result about a threshold voltage in the semiconductor device 100. The horizontal axis of FIG. 12 shows a gate voltage. The vertical axis of FIG. 12 shows a drain current flowing between the source electrode 152 and the drain electrode 154.

The result of FIG. 12 shows that the threshold voltage in the semiconductor device 100a is V1. Further, the threshold voltage in the semiconductor device 100 is V2 (>V1). Thus, the semiconductor device 100 was confirmed to have a higher threshold voltage than the semiconductor device 100a.

Figure 13:
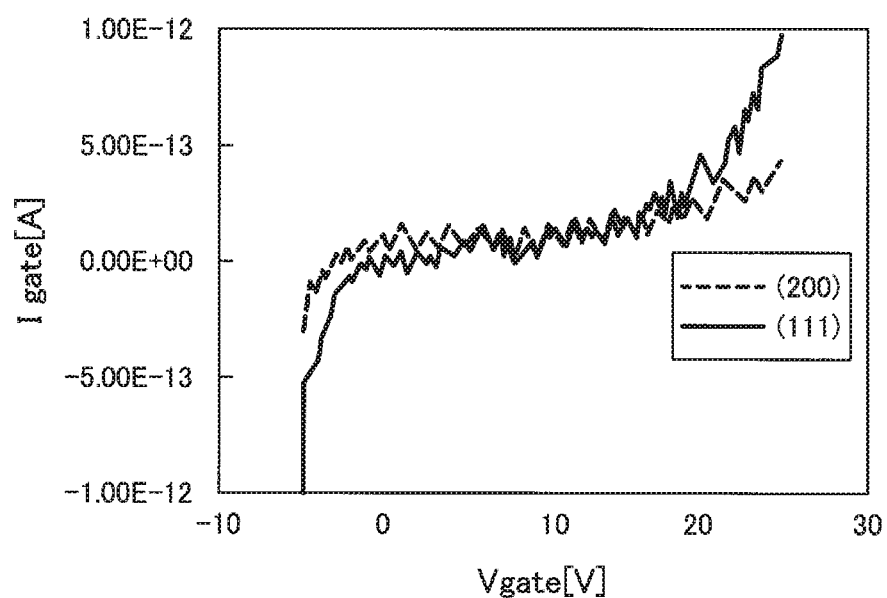
FIG. 13 is an explanatory view showing a measurement result about a gate leakage current.

FIG. 13 is an explanatory view showing a measurement result about a gate leakage current. A solid line of FIG. 13 shows a measurement result about a gate leakage current in the semiconductor device 100a. A dashed line of FIG. 13 shows a measurement result about a gate leakage current in the semiconductor device 100. The horizontal axis of FIG. 13 shows a gate voltage. The vertical axis of FIG. 13 shows a gate leakage current.

The result of FIG. 13 shows that a gate leakage current is lower in the semiconductor device 100 than in the semiconductor device 100a.

The results of FIGS. 12 and 13 show that, in the semiconductor device 100a, the gate voltage was reduced and the gate leakage current was increased by the occurrence of escape of nitrogen from the p-type semiconductor layer 130. The results of FIGS. 12 and 13 also show that, in the semiconductor device 100, nitrogen in the p-type semiconductor layer 130 was compensated for from the gate electrode 170 through the gate insulating film 160 in response to the occurrence of escape of nitrogen from the p-type semiconductor layer 130, allowing suppression of reduction in the gate voltage and suppression of increase in the gate leakage current.

According to the first embodiment described above, the gate electrode 170 made of titanium nitride including the (200) orientation is capable of compensating for more nitrogen through the gate insulating film 160 in response to escape of nitrogen from the p-type semiconductor layer 130 as a nitride semiconductor layer than a gate electrode made of titanium nitride including only the (111) orientation. This makes it possible to compensate for nitrogen in response to escape of nitrogen from the nitride semiconductor layer without using an insulating film made of silicon nitride.

In the semiconductor device 100 of the first embodiment, the gate electrode 170 is formed by reactive sputtering process under a condition that nitrogen partial pressure in the processing chamber is 0.270 Pa. This allows increase in the ratio of the (200) orientation in the crystal orientation of titanium nitride forming the gate electrode 170 in the manufactured semiconductor device 100.

In the semiconductor device 100 of the first embodiment, the gate electrode 170 is formed by reactive sputtering process and then subjected to heating process. This allows increase in the amount of nitrogen in the p-type semiconductor layer 130 to be compensated for from the gate electrode 170 through the gate insulating film 160.

Regarding power of binding between nitrogen and titanium in titanium nitride, this binding power is lower in titanium nitride as a material for the gate electrode 170 formed by reactive sputtering process in the first embodiment than in titanium nitride formed by atomic layer deposition process or chemical vapor deposition process. Thus, crystal grains of titanium nitride forming the gate electrode 170 tend to be formed imperfectly to allow an abundance of unstable nitrogen to exist at a crystal grain boundary of titanium nitride. For this reason, titanium nitride forming the gate electrode 170 of the first embodiment is capable of diffusing more nitrogen than titanium nitride formed by atomic layer deposition process or chemical vapor deposition process. In other words, the amount of nitrogen to be diffused from the gate electrode 170 becomes adjustable by changing a method of forming the gate electrode 170.

B. Second Embodiment

A semiconductor device of a second embodiment has a similar configuration to the semiconductor device 100 of the first embodiment, except that a gate electrode of the second embodiment is different from the gate electrode 170. The gate electrode of the second embodiment is made of tantalum nitride in a crystal orientation including the (200) orientation and the (220) orientation.

Figure 14:
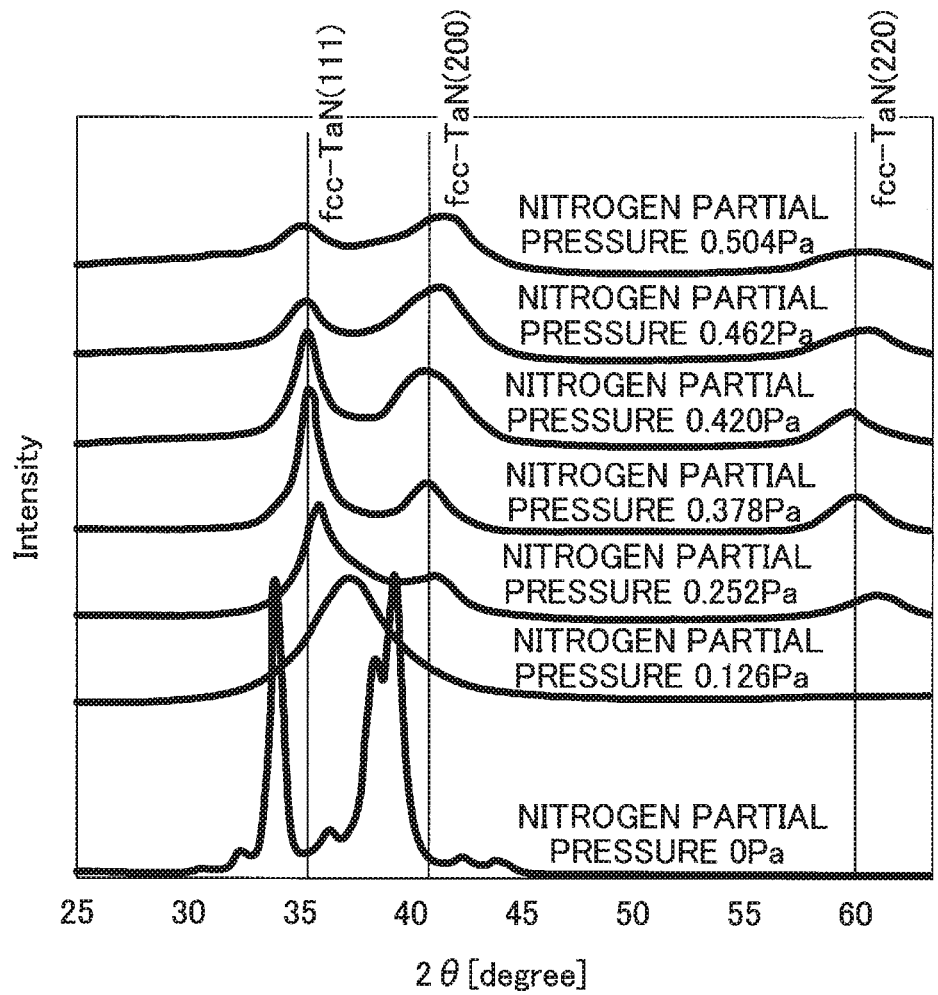
FIG. 14 is an explanatory view showing a result of measurement conducted by X-ray diffraction process.

Like in the first embodiment, the gate electrode of the second embodiment is formed by reactive sputtering process. FIG. 14 is an explanatory view showing a result of measurement conducted by X-ray diffraction process on gate electrodes formed by reactive sputtering process in a processing chamber under various conditions of nitrogen partial pressure. The horizontal axis of FIG. 14 shows a diffraction angle. The vertical axis of FIG. 14 shows a diffraction intensity. Waveforms in FIG. 14 each show the state of the crystal orientation of a gate electrode formed to contact the gate insulating film 160 under a corresponding condition of nitrogen partial pressure. The result of FIG. 14 shows that the ratio of the (111) orientation is reduced and the ratio of the (200) orientation and that of the (220) orientation are increased in the crystal orientation of tantalum nitride forming the gate electrode at higher nitrogen partial pressure. Like crystal in the (200) orientation, crystal in the (220) orientation has grown vertically to the plane of a gate insulating film. Thus, the (220) orientation causes nitrogen to be diffused easily along a crystal grain boundary. The gate electrode of the second embodiment is formed by reactive sputtering process under a condition that nitrogen partial pressure in the processing chamber is 0.252 Pa. The gate electrode of the second embodiment may be formed by reactive sputtering process under a condition that nitrogen partial pressure in the processing chamber is higher than 0.252 Pa.

According to the second embodiment described above, the gate electrode of the second embodiment made of tantalum nitride including the (200) orientation and the (220) orientation is capable of compensating for more nitrogen through the gate insulating film 160 in response to escape of nitrogen from the p-type semiconductor layer 130 as a nitride semiconductor layer than a gate electrode made of tantalum nitride including only the (111) orientation. This makes it possible to compensate for nitrogen in response to escape of nitrogen from the nitride semiconductor layer without using an insulating film made of silicon nitride.

The gate electrode of the second embodiment may also be subjected to heating process after being formed by reactive sputtering process to allow more nitrogen to be diffused from the gate electrode.

C. Third Embodiment

Figure 15:
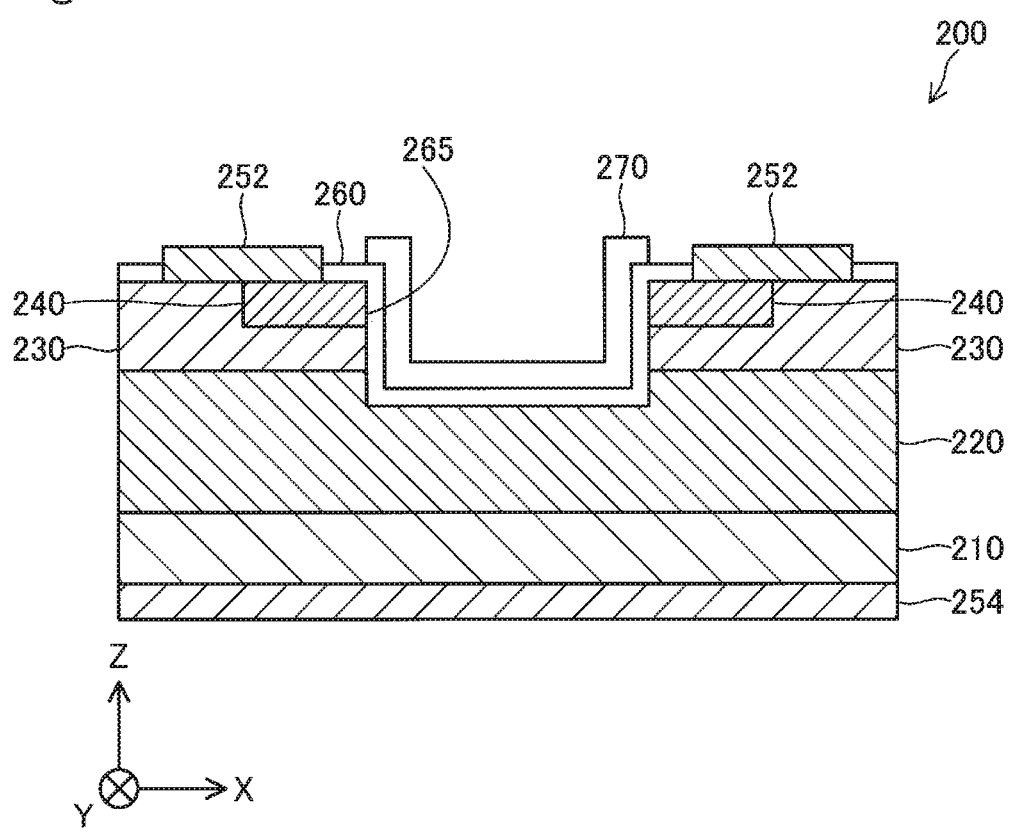
FIG. 15 is a sectional view schematically showing the configuration of a semiconductor device.

FIG. 15 is a sectional view schematically showing the configuration of a semiconductor device 200 of a third embodiment. The semiconductor device 200 is what is called a vertical MOSFET. The semiconductor device 200 includes a substrate 210, an n-type semiconductor layer 220, a p-type semiconductor layer 230, an n-type semiconductor layer 240, a source electrode 252, a drain electrode 254, a gate insulating film 260, and a gate electrode 270.

The substrate 210 is the same as the substrate 110 of the first embodiment. The p-type semiconductor layer 230 is similar to the p-type semiconductor layer 130 of the first embodiment, except that a trench 265 is formed in the center and the vicinity of the p-type semiconductor layer 230 in the direction of the X axis. The n-type semiconductor layer 220 and the n-type semiconductor layer 240 are semiconductors having n-type properties. The n-type semiconductor layer 220 is arranged under the p-type semiconductor layer 230. The n-type semiconductor layer 240 is arranged on the p-type semiconductor layer 230. The substrate 210 and each semiconductor layer are made of gallium nitride (GaN).

The source electrode 252 is arranged on the n-type semiconductor layer 240. The source electrode 252 also extends on the p-type semiconductor layer 230 and further functions as a body electrode. The drain electrode 254 is arranged under the substrate 210.

The trench 265 is a groove starting from the n-type semiconductor layer 240, passing through the p-type semiconductor layer 230, and cutting into a part of the n-type semiconductor layer 220. The configuration of the trench 265 is determined by dry etching on each semiconductor layer.

The gate insulating film 260 covers a surface of a part of the center and the vicinity of the n-type semiconductor layer 240 in the direction of the X axis and a surface of the trench 265. Like the gate insulating film 160 of the first embodiment, the gate insulating film 260 is made of silicon oxide ($SiO_2$) and formed by atomic layer deposition process.

The gate electrode 270 is formed to contact the gate insulating film 260 from above. Like the gate electrode 170 of the first embodiment, the gate electrode 270 is made of titanium nitride in a crystal orientation including the (200) orientation. Like the gate electrode 170 of the first embodiment, the gate electrode 270 is formed by reactive sputtering process and subjected to heating process after being formed by reactive sputtering process.

According to the third embodiment described above, the gate electrode 270 made of titanium nitride including the (200) orientation is capable of compensating for more nitrogen through the gate insulating film 260 in response to escape of nitrogen from the n-type semiconductor layer 220, the p-type semiconductor layer 230, and the n-type semiconductor layer 240 as nitride semiconductor layers than a gate electrode made of titanium nitride including only the (111) orientation. This makes it possible to compensate for nitrogen in response to escape of nitrogen from the nitride semiconductor layers without using an insulating film made of silicon nitride.

In the case a vertical MOSFET including a trench such as the semiconductor device 200, an oxide film is formed as an insulating film on a surface of a nitride semiconductor layer. Further, the surface of the nitride semiconductor layer is etched during formation of the trench. Hence, the vertical MOSFET is more likely to cause escape of nitrogen from the nitride semiconductor layer than a lateral MOSFET without a trench. In this regard, provision of a gate electrode such as that in each of the foregoing embodiments allows compensation for nitrogen in response to escape of nitrogen from the nitride semiconductor layer.

D. Other Embodiments

In each of the foregoing embodiments, the crystal orientation of the gate electrode is adjusted so as to form the (200) orientation by increasing nitrogen partial pressure in the processing chamber. However, this does not limit the present invention. For example, the crystal orientation of the gate electrode may be adjusted by applying high-frequency power in RF sputtering process or applying a substrate bias. Alternatively, the crystal orientation of the gate electrode may be adjusted so as to form the (200) orientation by increasing the ratio of the amount of nitrogen in gas to flow into the processing chamber.

In the first embodiment, the gate electrode 170 is made of titanium nitride in a crystal orientation including the (200) orientation. However, this does not limit the present invention. For example, the gate electrode 170 may be made of titanium nitride including the (220) orientation having a comparable crystal structure to the (200) orientation. The (200) orientation and the (220) orientation are considered to be comparable crystal structures. Thus, a gate electrode made of titanium nitride in a crystal orientation including the (220) orientation is supposed to achieve effect comparable to that achieved by the gate electrode 170 made of titanium nitride including the (200) orientation.

The disclosure is not limited to any of the embodiment and its modifications described above but may be implemented by a diversity of configurations without departing from the scope of the disclosure. For example, the technical features of any of the embodiments and their modifications may be replaced or combined appropriately, in order to solve part or all of the problems described above or in order to achieve part or all of the advantageous effects described above. Any of the technical features may be omitted appropriately unless the technical feature is described as essential in the description hereof. The present disclosure may be implemented by aspects described below.

(1) According to one aspect of the present invention, a semiconductor device is provided. The semiconductor device comprises: a nitride semiconductor layer; an oxide insulating film formed to contact the nitride semiconductor layer; and a gate electrode formed to contact the oxide insulating film and made of metal nitride in a crystal orientation including at least one of the (200) orientation and the (220) orientation. According to this aspect, the gate electrode made of metal nitride including at least one of the (200) orientation and the (220) orientation is capable of compensating for more nitrogen through the insulating film in response to escape of nitrogen from the nitride semiconductor layer than a gate electrode made of metal nitride including only the (111) orientation. This makes it possible to compensate for nitrogen in response to escape of nitrogen from the nitride semiconductor layer without using an insulating film made of silicon nitride.

(2) In the semiconductor device of the foregoing aspect, the gate electrode may be made of titanium nitride or tantalum nitride.

(3) In the semiconductor device of the foregoing aspect, the oxide insulating film may be made of silicon oxide.

(4) According to one aspect of the present invention, a method of manufacturing a semiconductor device comprising a gate electrode made of titanium nitride is provided. In this manufacturing method, the gate electrode is formed by reactive sputtering process under a condition that nitrogen partial pressure in a processing chamber is 0.270 Pa or more. This aspect allows manufacture of a semiconductor device in which the crystal orientation of titanium nitride forming the gate electrode includes the (200) orientation.

(5) According to one aspect of the present invention, a method of manufacturing a semiconductor device comprising a gate electrode made of tantalum nitride is provided. In this manufacturing method, the gate electrode is formed by reactive sputtering process under a condition that nitrogen partial pressure in a processing chamber is 0.252 Pa or more. This aspect allows manufacture of a semiconductor device in which the crystal orientation of tantalum nitride forming the gate electrode includes the (200) orientation and the (220) orientation.

(6) In the method of manufacturing the semiconductor device of the foregoing aspect, the gate electrode may be subjected to heating process after being formed by the reactive sputtering process. This aspect allows increase in the amount of nitrogen in the nitride semiconductor layer to be compensated for through a gate insulating film from the gate electrode.

The present invention is feasible in various aspects other than a semiconductor device and a method of manufacturing the same. For example, the present invention is feasible as Schottky barrier diodes, semiconductors, electrical equipment including the diodes and the semiconductors or the semiconductor device of the foregoing aspect, devices for manufacturing the semiconductor device, methods of designing such devices, and methods of manufacturing such devices.

What is claimed is:

1. A semiconductor device, comprising:
   a nitride semiconductor layer;
   an oxide insulating film configured to form to contact the nitride semiconductor layer;
   a gate electrode configured to form to contact the oxide insulating film and including a metal nitride in a crystal orientation including at least one of a (200) orientation and a (220) orientation, the gate electrode layered along a trench structure with the oxide insulating film;
   an n-type semiconductor region embedded in the nitride semiconductor layer and being disposed on a surface of the oxide insulating film; and
   a source electrode arranged on the n-type semiconductor region and extending from a surface of the n-type semiconductor region to a surface of the nitride semiconductor layer,
   wherein the semiconductor device includes a vertical MOSFET comprising the trench structure penetrating into the nitride semiconductor layer such that a bottom surface of the trench structure is disposed below a bottom surface of the nitride semiconductor layer,
   wherein the gate electrode has a layered shape such that a groove penetrates the gate electrode to expose surfaces of the gate electrode to each other, inside the trench structure, the surfaces of the gate electrode being located on opposing sides of the groove,
   wherein the gate electrode is disposed from the bottom surface of the trench structure to an uppermost surface of the oxide insulating film, and
   wherein, on opposing sides of the source electrode, the oxide insulating film extends above the surface of the nitride semiconductor layer which is coplanar with the surface of the n-type semiconductor region.

2. The semiconductor device in accordance with claim 1, wherein the metal nitride of the gate electrode comprises titanium nitride or tantalum nitride.

3. The semiconductor device in accordance with claim 1, wherein the oxide insulating film comprises silicon oxide.

4. A method of manufacturing the semiconductor device in accordance with claim 1, wherein the metal nitride of the gate electrode comprises nitride, and
   wherein the gate electrode is formed by a reactive sputtering process under a condition that nitrogen partial pressure in a processing chamber is 0.270 Pa or more.

5. A method of manufacturing the semiconductor device in accordance with claim 1, wherein the metal nitride comprises tantalum nitride, and
   wherein the gate electrode is formed by a reactive sputtering process under a condition that nitrogen partial pressure in a processing chamber is 0.252 Pa or more.

6. A method of manufacturing the semiconductor device in accordance with claim 4, wherein the gate electrode is subjected to a heating process after being formed by the reactive sputtering process.

7. The semiconductor device in accordance with claim 1, further comprising:
   a drain electrode, at least one of a bottom surface of the source electrode and a bottom surface of the drain electrode being coplanar with a bottom surface of the oxide insulating film.

8. The semiconductor device in accordance with claim 7, wherein the bottom surface of the source electrode and the bottom surface of the drain electrode are coplanar with the bottom surface of the oxide insulating film.

9. The semiconductor device in accordance with claim 7, wherein the oxide insulating film is disposed on a surface of the drain electrode, and
   wherein the oxide insulating film is further disposed on a surface of the source electrode.

10. The semiconductor device in accordance with claim 7, wherein the oxide insulating film abuts a side surface of the source electrode and a side surface of the drain electrode.

11. The semiconductor device in accordance with claim 10, wherein the side surface of the source electrode and the side surface of the drain electrode extend above an uppermost surface of the nitride semiconductor layer.

12. The semiconductor device in accordance with claim 1, wherein the source electrode and the drain electrode are disposed on an upper surface of the nitride semiconductor layer.

13. The semiconductor device in accordance with claim 1, wherein the oxide insulating film is disposed on a top surface of the nitride semiconductor layer, a top surface of the n-type semiconductor region, a side surface of the source electrode, a side surface of the drain electrode, and a bottom surface of the gate electrode.

14. The semiconductor device in accordance with claim 1, wherein the oxide insulating film abuts the nitride semiconductor layer, the n-type semiconductor region, the source electrode, the drain electrode, and the gate electrode.

15. The semiconductor device in accordance with claim 1, wherein the n-type semiconductor region abuts the drain electrode and the nitride semiconductor layer.

16. The semiconductor device in accordance with claim 1, further comprising an n-type semiconductor layer disposed on the bottom surface of the nitride semiconductor layer, the bottom surface of the trench structure being located above a bottom surface of the n-type semiconductor layer and below a top surface of the n-type semiconductor layer.

17. A semiconductor device, comprising:
   a nitride semiconductor layer;
   an insulating film disposed on a surface of the nitride semiconductor layer;
   a gate electrode disposed on the insulating film and including a metal nitride in a crystal orientation including at least one of a (200) orientation and a (220) orientation, the gate electrode layered along a trench structure with the insulating film;
   an n-type semiconductor region embedded in the nitride semiconductor layer and being disposed on a surface of the insulating film; and
   a source electrode arranged on the n-type semiconductor region and extending from a surface of the n-type semiconductor region to the surface of the nitride semiconductor layer,
   wherein the semiconductor device includes a vertical MOSFET comprising the trench structure penetrating into the nitride semiconductor layer such that a bottom surface of the trench structure is disposed below a bottom surface of the nitride semiconductor layer,
   wherein the gate electrode has a layered shape such that a groove penetrates the gate electrode to expose surfaces of the gate electrode to each other, inside the trench structure, the surfaces of the gate electrode being located on opposing sides of the groove,
   wherein the gate electrode is disposed from the bottom surface of the trench structure to an uppermost surface of the insulating film wherein the gate electrode has the layered shape, and
   wherein, on opposing sides of the source electrode, the insulating film extends above the surface of the nitride semiconductor layer which is coplanar with the surface of the n-type semiconductor region.

18. The semiconductor device in accordance with claim 17, further comprising an n-type semiconductor layer disposed on the bottom surface of the nitride semiconductor layer, the bottom surface of the trench structure being located above a bottom surface of the n-type semiconductor layer and below a top surface of the n-type semiconductor layer.

19. The semiconductor device in accordance with claim 17, further comprising:
   a drain electrode, at least one of the source electrode and the drain electrode being disposed above an uppermost surface of the nitride semiconductor layer,
   wherein the insulating film abuts the nitride semiconductor layer, the n-type semiconductor region, the source electrode, the drain electrode, and the gate electrode.

20. The semiconductor device in accordance with claim 1, wherein the surface of the nitride semiconductor layer extends from an edge of the n-type semiconductor region to an outer edge of the semiconductor device.

* * * * *